US008774858B2

(12) United States Patent
Yucek et al.

(10) Patent No.: US 8,774,858 B2
(45) Date of Patent: Jul. 8, 2014

(54) ADAPTIVE RF SATURATION DETECTION IN A WIRELESS DEVICE IMPLEMENTING MULTIPLE WIRELESS PROTOCOLS

(75) Inventors: Tevfik Yucek, Santa Clara, CA (US); Sundar G. Sankaran, Campbell, CA (US); Paul Petrus, San Jose, CA (US)

(73) Assignee: Qualcomm Incorporated, San Diego, CA (US)

( * ) Notice: Subject to any disclaimer, the term of this patent is extended or adjusted under 35 U.S.C. 154(b) by 568 days.

(21) Appl. No.: 13/110,470

(22) Filed: May 18, 2011

(65) Prior Publication Data

US 2012/0294398 A1 Nov. 22, 2012

(51) Int. Cl.
*H04B 1/06* (2006.01)
*H04B 7/00* (2006.01)
*H04M 1/00* (2006.01)

(52) U.S. Cl.
USPC .................................... 455/552.1; 455/234.1

(58) Field of Classification Search
CPC .................................... H04B 1/16; H03G 3/20
USPC ........... 455/552.1, 232.1, 234.1, 234.2, 250.1
See application file for complete search history.

(56) References Cited

U.S. PATENT DOCUMENTS

| | | | |
|---|---|---|---|
| 5,278,994 A | 1/1994 | Black et al. | |
| 7,242,914 B2 | 7/2007 | Khayrallah | |
| 7,301,402 B2 | 11/2007 | Norris et al. | |
| 7,353,010 B1 | 4/2008 | Zhang et al. | |
| 7,430,406 B2 | 9/2008 | Filipovic | |
| 7,863,983 B2 | 1/2011 | Yuen et al. | |
| 7,899,396 B2 | 3/2011 | Meylan et al. | |
| 7,948,312 B2 | 5/2011 | Cao | |
| 8,155,612 B1* | 4/2012 | Husted et al. | 455/234.1 |
| 8,406,719 B1* | 3/2013 | Neng et al. | 455/226.2 |
| 2003/0181175 A1 | 9/2003 | Darabi | |
| 2004/0063412 A1 | 4/2004 | Kim et al. | |
| 2007/0066222 A1 | 3/2007 | Tao et al. | |
| 2007/0129034 A1 | 6/2007 | Adams et al. | |
| 2007/0207752 A1 | 9/2007 | Behzad | |
| 2007/0274273 A1 | 11/2007 | Grushkevich et al. | |
| 2008/0139119 A1 | 6/2008 | Behzad et al. | |
| 2008/0160945 A1 | 7/2008 | Crinon et al. | |
| 2008/0279138 A1 | 11/2008 | Gonikberg et al. | |
| 2008/0279162 A1 | 11/2008 | Desai | |
| 2008/0291983 A1 | 11/2008 | Myers | |
| 2009/0061919 A1 | 3/2009 | Rofougaran | |
| 2009/0156145 A1* | 6/2009 | Lindstrom et al. | 455/200.1 |
| 2009/0239471 A1 | 9/2009 | Tran et al. | |
| 2010/0105448 A1 | 4/2010 | Andrys et al. | |
| 2013/0301764 A1* | 11/2013 | Shi et al. | 375/345 |

OTHER PUBLICATIONS

International Search Report and Written Opinion—PCT/US2012/038619—ISA/EPO—Sep. 11, 2012.

\* cited by examiner

*Primary Examiner* — Nguyen Vo
(74) *Attorney, Agent, or Firm* — Bay Area Technology Law Group PC

(57) ABSTRACT

System and method for detecting radio frequency (RF) saturation in a wireless device configured to simultaneously receive first signals according to a first wireless protocol and second signals according to a second wireless protocol. Signals having components of both the first and second signals may be received at a shared gain element. A level of saturation of the shared gain element may be determined. A current definition of a saturation event may be determined. A gain adjustment value may be determined based on the level of saturation and the current definition of a saturation event. A gain value of the shared gain element may be adjusted by the determined gain adjustment value.

16 Claims, 8 Drawing Sheets

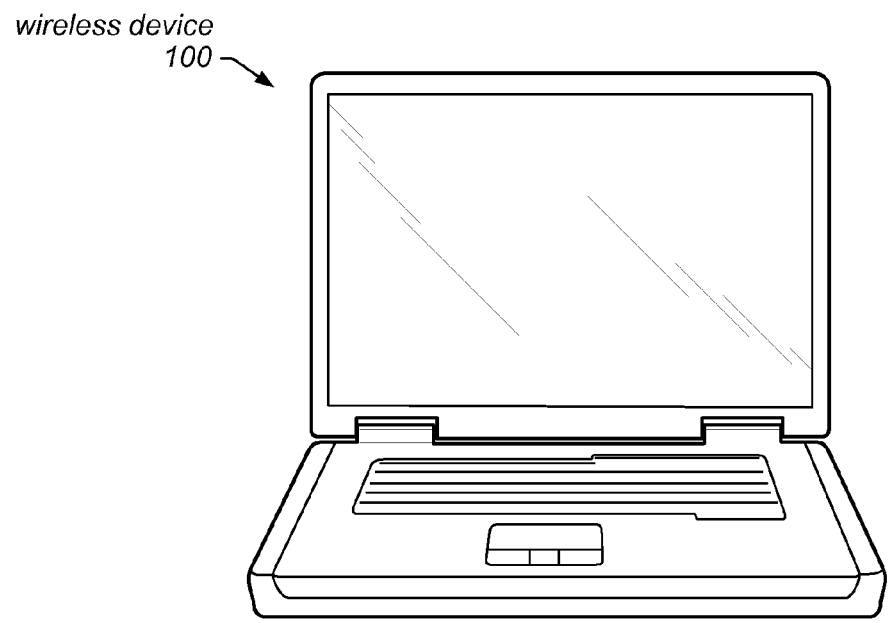
FIG. 1A
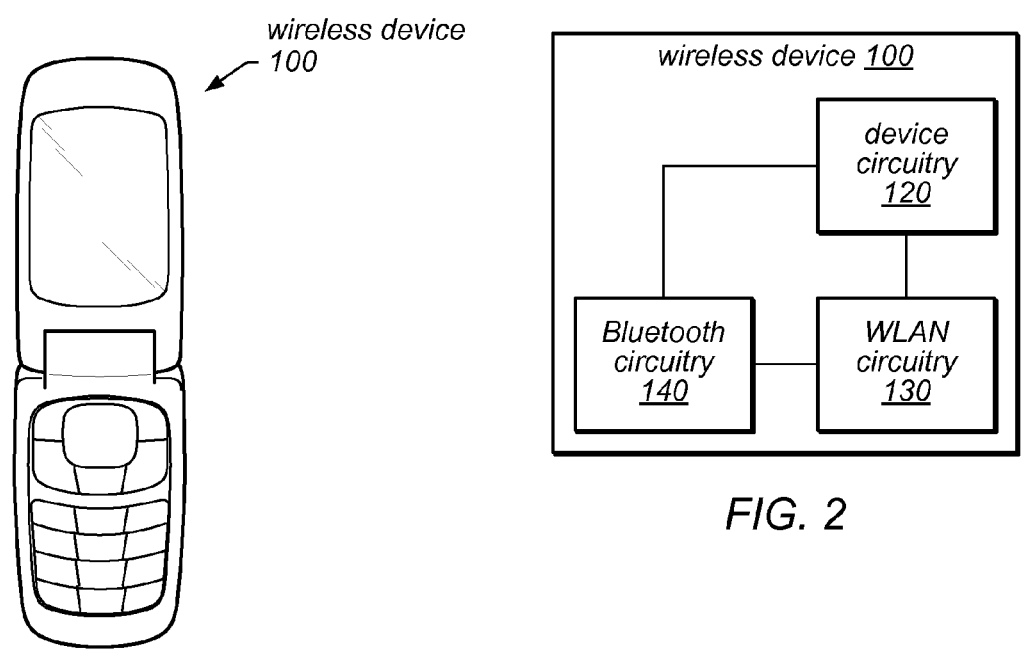
FIG. 1B
FIG. 2

ADAPTIVE RF SATURATION DETECTION IN A WIRELESS DEVICE IMPLEMENTING MULTIPLE WIRELESS PROTOCOLS

BACKGROUND OF THE INVENTION

1. Field of the Disclosure

The present invention relates generally to wireless communication, and more particularly to adaptive radio frequency (RF) saturation detection in a wireless device implementing multiple wireless protocols.

2. Description of the Related Art

Wireless radio frequency (RF) communication is being used for a plethora of applications, such as in laptops, cell phones, and other wireless communication devices ("wireless devices"). In fact, wireless communication is becoming so widely used, it is common for wireless devices to be able to communicate using a plurality of different wireless communication protocols. Accordingly, it is common for a wireless device to have different circuit portions that implement different wireless protocols.

An automatic gain control (AGC) unit in a receiving wireless device typically adjusts the gain of an RF front end and other processing units during reception of wireless signals to enable proper reception. The AGC unit typically adjusts the gain of the RF front end and other processing units based on analyzing the power of a digitized RF signal at the output of an analog to digital converter (ADC). This analysis and adjustment is complicated in the case of a wireless device intended to simultaneously receive multiple signals of different wireless protocols. Accordingly, improvements in RF signal analysis and control are desired.

SUMMARY OF THE INVENTION

Embodiments of the disclosure relate to a wireless device having a gain element that is shared among different circuit portions implementing different wireless protocols, referred to as a shared gain element. The wireless device may adaptively detect RF saturation and determine corresponding gain adjustments.

The wireless device may include an antenna for receiving wireless signals. The wireless device may also include first wireless protocol circuitry for processing the first signals according to the first wireless protocol and second wireless protocol circuitry for processing the second signals according to the second wireless protocol. The first and second wireless protocol circuitries may be coupled to the antenna and configured to receive first and second signals, respectively, from the antenna. The wireless device may also include a shared gain element.

The wireless device may include logic configured to detect saturation events for received signals. The logic may be configured to adjust a gain value of the shared gain element based on a detected saturation event. The logic may be configured to dynamically adjust a definition of a saturation event.

The logic may be configured to adjust the definition of a saturation event based on relative priority levels of the first and second signals. The logic may also or alternatively be configured to adjust the definition of a saturation event based on the reception states of the first and second wireless protocol circuitries.

For example, in some embodiments the logic may be configured to determine a level of saturation of the shared gain element, determine a look-up table (e.g., relating levels of saturation to gain adjustment values) corresponding to current reception states of the first and second wireless protocol circuitries and priorities of the first and second signals, determine a gain adjustment value corresponding to the determined level of saturation based on the look-up table, and adjust the gain value of the shared gain element by the determined gain adjustment value.

There may in some embodiments be a plurality of look-up tables from which the logic may choose. The plurality of look-up tables may correspond to various possible reception states of the first and second wireless protocol circuitries and priorities of the first and second signals.

In some embodiments, the logic may be configured to adjust the definition of a saturation event on a per-packet basis.

In some embodiments, the first wireless protocol may be WLAN and the second wireless protocol may be Bluetooth.

Some embodiments of the disclosure relate to a chip for use in a wireless device. The chip may include some or all of the elements of the wireless device described above (e.g., the shared gain element, the logic configured to detect saturation events, etc.), according to various embodiments, and may accordingly be configured to implement some or all of the functionality described with respect thereto.

Further embodiments of the disclosure relate to a method for avoiding radio frequency (RF) saturation in a wireless device configured to simultaneously receive first signals according to a first wireless protocol and second signals according to a second wireless protocol, e.g., a wireless device such as described above. The method may include receiving signals (including first and second signals) at a shared gain element. A level of saturation of the shared gain element may be determined. A current definition of a saturation event may be determined. A gain adjustment value may be determined based on the level of saturation and the current definition of a saturation event. A gain value of the shared gain element may be adjusted by the determined gain adjustment value.

Determining the current definition of a saturation event may be based on either or both of a reception state of the wireless device with respect to one or more of the first signals or the second signals, or a priority of one or more of the first signals or the second signals.

In some embodiments, determining the level of saturation, determining the current definition of a saturation event, determining the gain adjustment value, and adjusting the gain value may be performed on a per-packet basis.

In some embodiments, a look-up table (e.g., relating levels of saturation to gain adjustment values) corresponding to current reception states of the wireless device with respect to the first and second signals and priorities of the first and second signals may be determined. In this case, the determined gain adjustment value may correspond to the determined level of saturation in the determined look-up table. There may be a plurality of possible look-up tables, e.g., corresponding to various possible reception states of the wireless device with respect to the first and second signals and priorities of the first and second signals.

In some embodiments, the first wireless protocol may be WLAN and the second wireless protocol may be Bluetooth.

BRIEF DESCRIPTION OF THE DRAWINGS

A better understanding of the present invention can be obtained when the following Detailed Description of the Embodiments is read in conjunction with the following drawings, in which:

FIGS. 1A and 1B illustrates exemplary wireless devices, according to one embodiment;

FIG. 2 is an exemplary block diagram of the wireless devices of FIGS. 1A and 1B, according to one embodiment;

Figure 3:
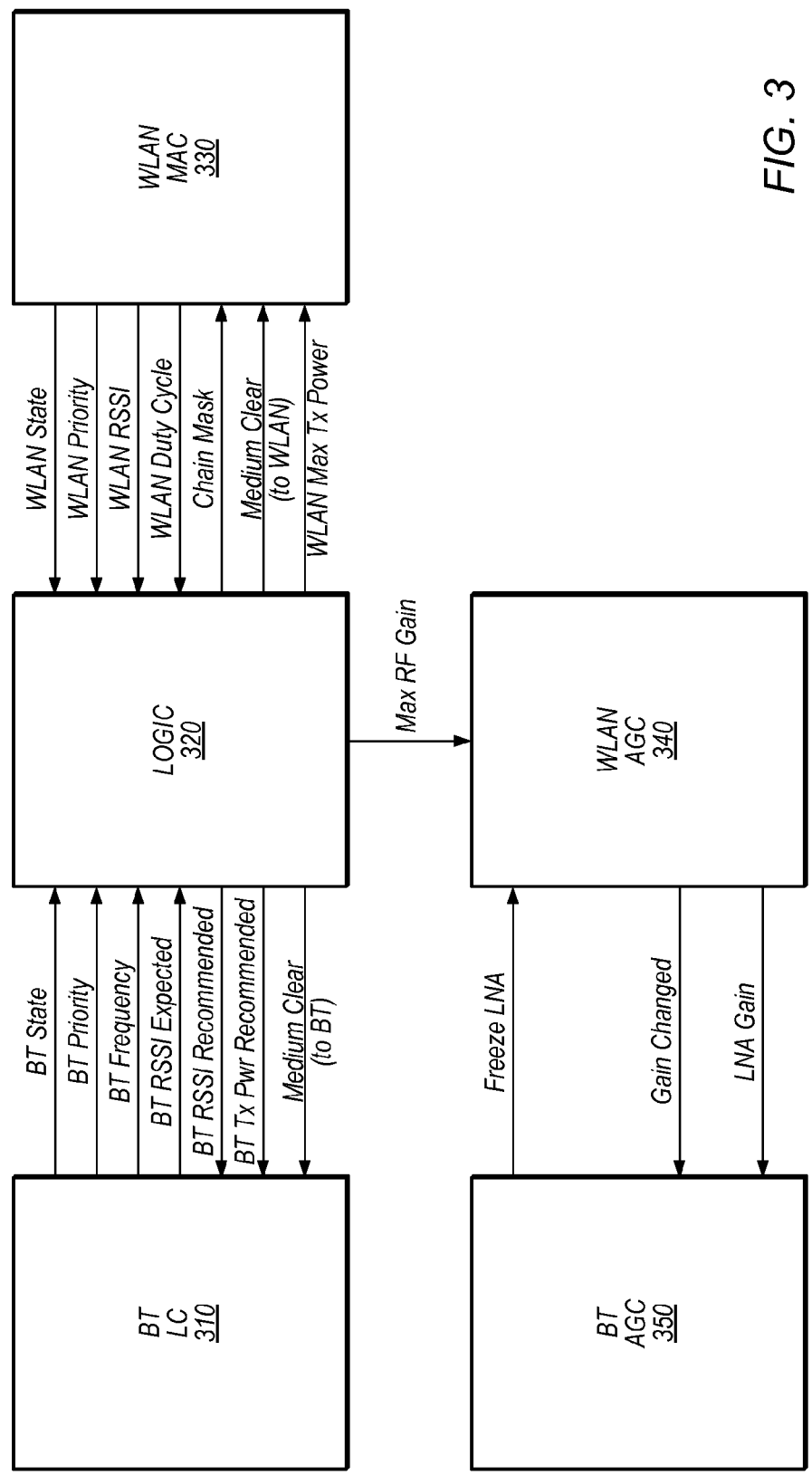
FIG. 3 is a more detailed exemplary block diagram of the wireless devices of FIGS. 1A and 1B, illustrating Bluetooth circuitry and WLAN circuitry of the exemplary wireless devices, according to one embodiment.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS OF THE INVENTION

Incorporation by Reference

The following references are incorporated by reference in their entirety as if set forth fully and completely herein:

U.S. application Ser. No. 12/323,338, titled "Wireless Device Using A Shared Gain Stage For Simultaneous Reception Of Multiple Protocols", filed Nov. 25, 2008, whose inventors are Paul J. Husted, Srenik Mehta, and Soner Ozgur.

U.S. application Ser. No. 12/541,284, titled "Wireless Device Using a Shared Gain Stage for Simultaneous Reception of Multiple Protocols", filed Aug. 14, 2009, whose inventor is Paul J. Husted.

U.S. application Ser. No. 12/706,932, titled "Automatic Gain Control Techniques for Detecting RF Saturation", filed Feb. 17, 2010, whose inventors are Kai Shi and Ning Zhang.

U.S. application Ser. No. 12/767,563, titled "Transferring Control of a Common Gain Element in a Wireless Device Supporting Multiple Protocols", filed Apr. 26, 2010, whose inventors are Sundar G. Sankaran, Tevfik Yucek, and Paul Petrus.

FIGS. 1A and 1B—Exemplary Wireless Devices

FIGS. 1A and 1B illustrate an exemplary wireless device 100, according to one embodiment. As shown in FIG. 1A, the wireless device 100 may be a portable computer or other mobile computing device. Alternatively, as shown in FIG. 1B, the wireless device 100 may be a cell phone or smart phone or other similar mobile device (which may also be classified as a mobile computing device). However, it should be noted that other wireless devices are envisioned, such as personal digital assistants, multimedia players (portable or stationary), routers, and/or other mobile devices/computing systems which are operable to use wireless communication.

The wireless device 100 may be configured to perform wireless communication (e.g., radio frequency (RF) communication) using a first wireless protocol and/or a second wireless protocol. For example, the wireless device 100 may be configured to perform wireless communication using only the first wireless protocol, using only the second wireless protocol, or simultaneously using both the first and second wireless protocol. The first and second wireless protocols may be any of various types of protocols. In some embodiments, the first wireless protocol may be a wireless local area network (WLAN) protocol. Additionally, the second wireless protocol may be a short range wireless communication protocol, such as Bluetooth. As used herein, a short range wireless protocol may refer to wireless protocols which support distances of up to 1 meter to 10 meters, or in higher powered devices, up to 100 meters.

The wireless device 100 may include an RF front end. Traditionally, AGC control of an RF front end has been performed based on a power of an RF signal at an output of an analog to digital converter (ADC) ("ADC power") and an in-band power. The ADC bandwidth (e.g., 40 to 80 MHz) is much smaller than the RF bandwidth (typically 2.4 GHz or 5 GHz), and thus does not cover the entire RF spectrum. Therefore, the ADC power typically does not provide a good representation of out-of-band signals and a strong interfering out-of-band signal may not be detected in the ADC power or in the in-band power. AGC operations rely on the ADC output to calculate a noise floor and determine gain settings of various components in a receive chain. However, because of the low visibility of the ADC, the strong out-of-band interfering signal may not be taken into consideration while determining the noise floor and the gain settings. Thus, the strong out-of-band interfering signal may cause saturation of an RF front end, which may not be detected because the saturation is not reflected in the ADC power (e.g., because the strong out-of-band signal is filtered out before being provided to the ADC). This can result in gain compression, small in-band power, etc., which can lead to incorrect calibration of the noise floor. Moreover, a strong in-band interfering signal may also cause the ADC output to become saturated. The AGC may require multiple trials and errors to determine a desirable gain setting. This may be because the AGC may only be aware of the saturated ADC output and may be unaware of the actual ADC power or by how much to reduce RF gain in order to eliminate saturation and receive the RF signal.

Additionally, it may not be possible to receive the RF signal if the out-of-band interfering signal is much stronger that the in-band signal.

Functionality can be implemented in the RF front end to help avoid gain compression and saturation in the RF front end. In some embodiments, the RF front end in the receive chain may be modified to include a peak detector and an RF saturation detection unit that can help determine the strength of the RF signal. The amplitude of the RF signal can thus be compared with a set of thresholds to determine whether and how often the RF front end is saturated. The AGC unit can receive a notification of the RF saturation and accordingly set the RF gain at an appropriate value in order to facilitate RF signal reception without distortion. This can help minimize RF saturation, gain compression, false detection and other performance degradation.

Furthermore, in some embodiments, the wireless device 100 may be able to communicate (e.g., receive wireless signals) simultaneously using both the first wireless protocol and the second wireless protocol. For example, as will subsequently be described further with respect to various embodiments, the wireless device 100 may implement a shared receive chain including a gain element shared by both the first wireless protocol and the second wireless protocol. In this case, because of the additional complexity introduced by the shared nature of the receive chain, it may be desirable that the RF saturation detection unit and gain adjustments resulting from saturation detection be adaptable to varying conditions relating to the coexistence of the first and second wireless protocols. Accordingly, embodiments of the present disclosure relate to a method for adaptive RF saturation detection and gain adjustment of a wireless device implementing multiple wireless protocols, and a wireless device configured to implement the method.

FIGS. 2 and 3—Exemplary Block Diagram of the Wireless Device

As shown in FIG. 2, the wireless device 100 may include device circuitry 120 (for performing various functions of the wireless device), first wireless protocol circuitry (or logic) 130, and second wireless protocol circuitry (or logic) 140. The various logic or circuitry described herein may be may be implemented in any of various ways, such as analog logic, digital logic, a processor and memory (such as a CPU, DSP, microcontroller, etc.), an ASIC (application specific integrated circuit), an FPGA (field programmable gate array), or any combination of the above.

The first wireless protocol circuitry 130 may be comprised on a first chip, and the second wireless protocol circuitry 140 may be comprised on a second chip. As used herein, the term "chip" has the full extent of its ordinary meaning, and includes an electronic device, e.g., a semiconductor device, that may be implemented in any of the ways described above for the first wireless protocol circuitry 130 and the second wireless protocol circuitry 140. In other embodiments, the circuitry 130 and 140 may be on the same chip.

In one exemplary embodiment, the first wireless protocol circuitry 130 may be WLAN circuitry 130 and the second wireless protocol circuitry 140 may be Bluetooth circuitry 140. The WLAN circuitry 130 and the Bluetooth 140 circuitry may be co-located, e.g., may be located in the same wireless device 100.

In one embodiment, the wireless device 100 may include a shared gain element that is used by both the first wireless protocol circuitry 130 and the second wireless protocol circuitry 140. The shared gain element may be comprised in the first wireless protocol circuitry 130 in one embodiment. The term "shared gain element" refers to a gain element (such as an amplifier, e.g., an LNA, gain stage, etc.) that amplifies signals such that portions of the amplified signals are provided to either one of the first and second wireless protocol circuitry 130 and 140 (or 140, FIGS. 4 and 5), respectively. The device 100 may also include logic for detecting saturation of the shared gain element (e.g., the LNA), as described below.

Additionally, the wireless device 100 may include one or more wireless or wired ports for communicating over a network. The wireless device 100 (e.g., the device circuitry 120) may further include one or more memory mediums and processors for implementing various functionality.

FIG. 3 provides a more detailed block diagram of one embodiment of the wireless device 100. As shown in this Figure, the wireless device 100 includes Bluetooth Link Control (LC) 310, logic 320, WLAN MAC 330, WLAN automatic gain control (AGC) 340, and BT AGC 350. As shown in this Figure, the Bluetooth Link Control 310 may provide BT State, BT Priority, BT Frequency, and BT RSSI expected signals to logic 320. Logic 320 may provide BT RSSI recommended, BT transmission power recommended, and medium clear signals to Bluetooth Link Control 310. Logic 320 may also provide chain mask, medium clear, and WLAN max transmission power signals to WLAN MAC 330. Logic 320 may receive WLAN state, WLAN priority, WLAN RSSI, and WLAN duty cycle signals from WLAN MAC 330. Logic 320 may provide a max RF gain to WLAN AGC 340. WLAN AGC 340 may also receive freeze LNA signals from BT AGC 350 as well as provide gain changed and LNA gain signals to BT AGC 350. The various signals and blocks shown in FIG. 3 may be utilized to implement RF saturation detection as described herein. The various signals and blocks shown in FIG. 3 may also be utilized to implement various other functionality of the wireless device 100.

It should be noted that, according to various embodiments, the freeze LNA, gain changed, and LNA gain signals shown in FIG. 3 can be exchanged between BT AGC and WLAN AGC using a message control interface (MCI), or, alternatively, direct wiring between the two blocks may be employed, if desired.

Note that the various signals and blocks shown in FIG. 3 are exemplary only and variations are envisioned. For example, the AGC 340 and 350 may be combined together and even combined into the device circuitry (or logic) 120 or logic 320. Additionally, the various portions of described above may be controlled by different portions of the wireless device. For example, BT AGC may receive the max RF gain instead of WLAN AGC (e.g., the BT circuitry may control the LNA).

Figure 4:
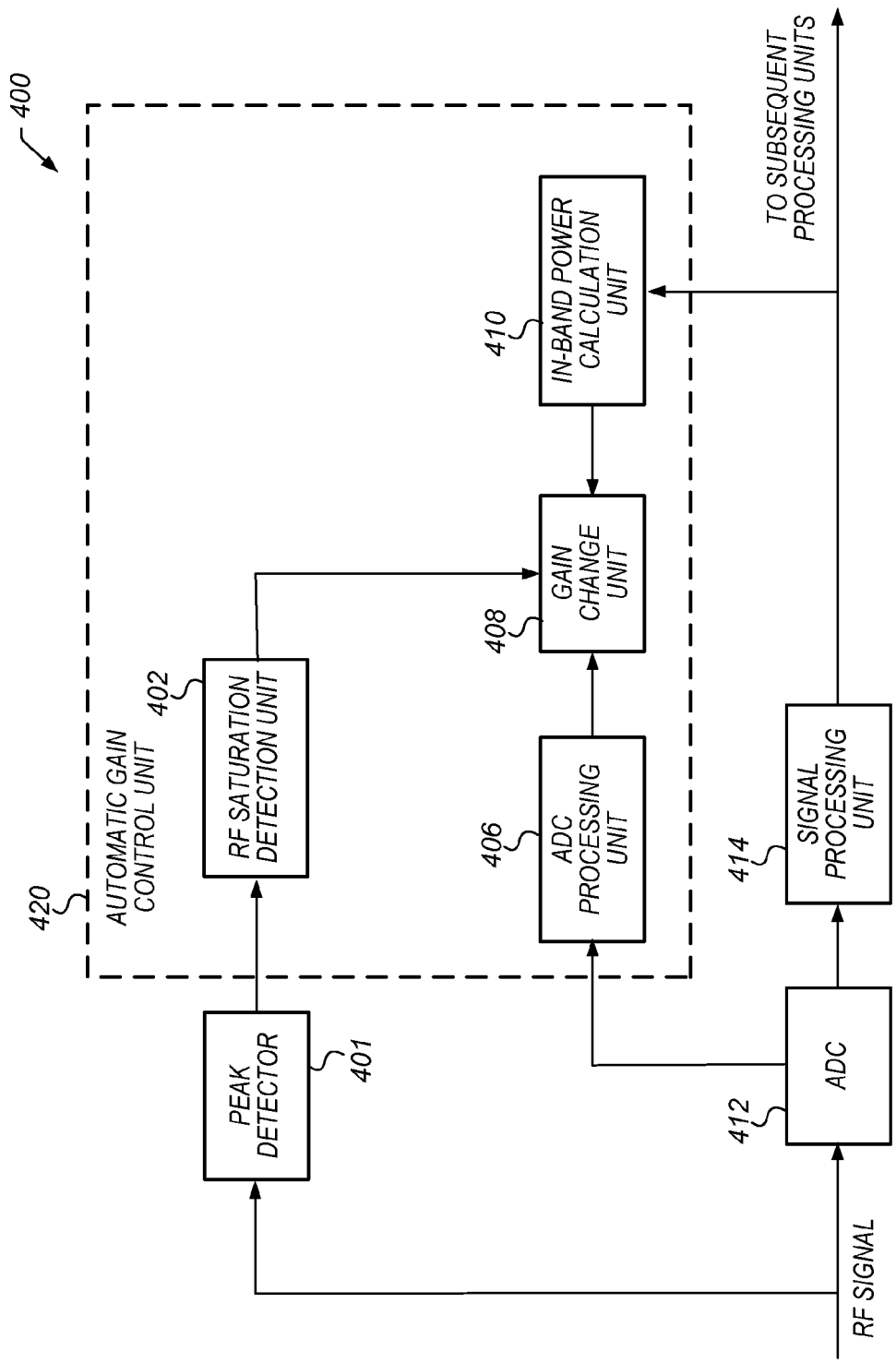
FIGS. 4 and 5 are exemplary block diagrams illustrating an RF saturation detection mechanism and a peak detector suitable for use in such a mechanism.
Figure 5:
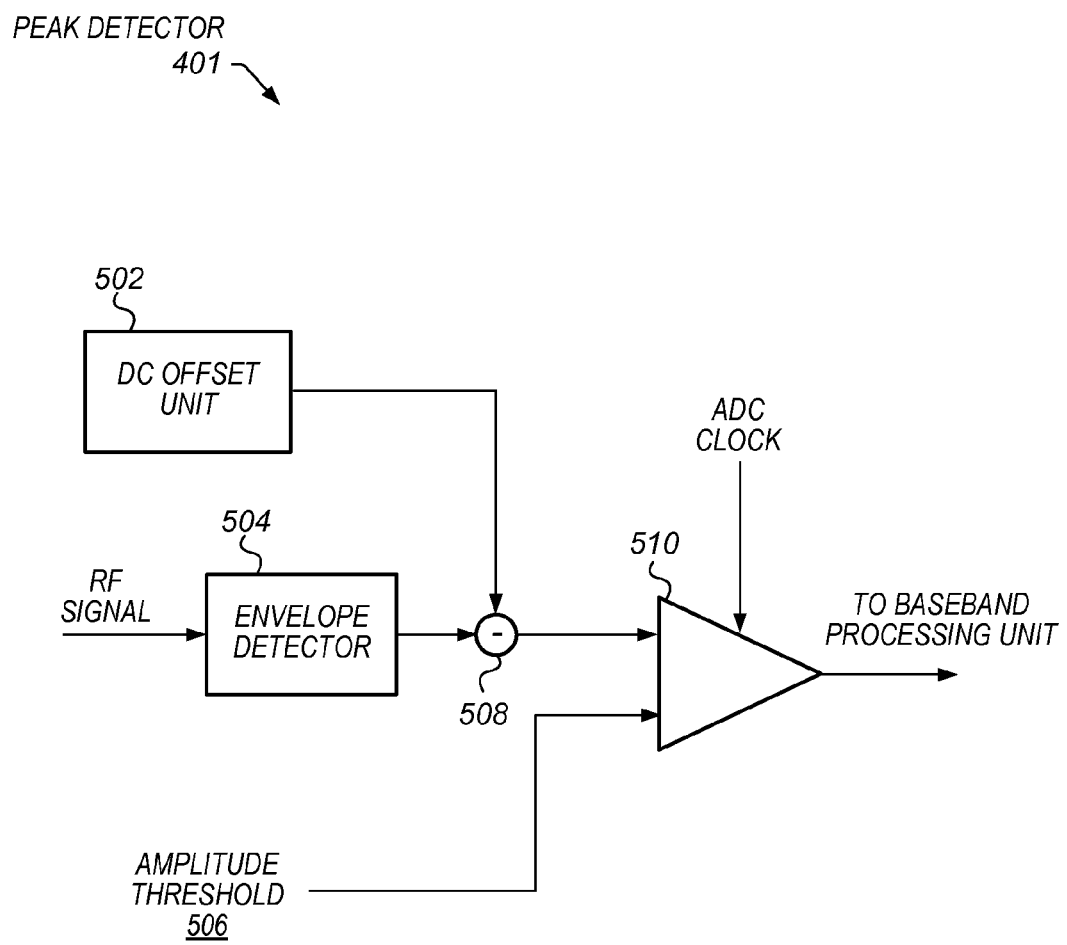

FIGS. 4 and 5—Exemplary Block Diagrams Illustrating an RF Saturation Detection Mechanism and a Peak Detector Suitable for Use in Such a Mechanism.

FIG. 4 is a block diagram illustrating a receive chain 400 comprising a mechanism for detecting RF saturation and accordingly reducing RF gain. FIG. 5 is a block diagram illustrating a peak detector suitable for use as part of the mechanism for detecting RF saturation. The mechanism shown in and described below with respect to FIGS. 4 and 5 may be used in a wireless device implementing multiple wireless protocols, such as a wireless device according to any of the embodiments described in this disclosure. For example, in some embodiments the mechanism of FIG. 4 (or a variation thereof) may be used in conjunction with embodiments of the method for adaptively detecting RF saturation and adjusting gain of the wireless device described herein. Alternative mechanisms for detecting RF saturation are also possible.

In some embodiments, the mechanism 400 may include a peak detector 401, an automatic gain control (AGC) unit 420, an analog to digital converter (ADC) 412, and a signal processing unit 414. The AGC unit 420 may include an RF saturation detection unit 402, an ADC processing unit 406, a gain change unit 408, and an in-band power calculation unit 410. As shown in FIG. 4, a received RF signal may be provided to the peak detector 401 and to the ADC 412. The output of the peak detector 401 may be provided to the RF saturation detection unit 402. The output of the RF saturation detection unit 402 may be provided to the gain change unit 408. The output of the ADC 412 may be provided to the signal processing unit 414 and to the ADC processing unit 406. The output of the signal processing unit 414 may be provided to the in-band power calculation unit 410 and to subsequent processing units. The output of the in-band power calculation unit 410 and the output of the ADC processing unit 406 may be provided to the gain change unit 408.

The peak detector 401 may be configured to detect saturation in an RF front end. In one set of embodiments, the peak detector 401 may determine and indicate a number of times (within a time interval) the amplitude of a signal exceeds an amplitude threshold. As noted above, FIG. 5 illustrates an example block diagram of the peak detector 401. The peak detector 401 may include a DC offset unit 502, an envelope detector 504, an amplitude threshold 506, and a comparator 510. The envelope detector 504 may be configured to receive an RF signal. The envelope detector 504 may follow the narrowband envelope of the received RF signal and generate an amplitude of the received RF signal at the output of the envelope detector 504. The subtractor 508 may subtract a DC offset, generated by the DC offset unit 502, from the amplitude of the received RF signal at the output of the envelope detector 504. In one implementation, the DC offset unit 502 may be a 6-bit DAC. In other implementations, the DC offset unit 502 can be other suitable components that generate the requisite DC offset.

The DC offset unit 502 may generate the DC offset to cancel the DC offset of the envelope detector 504. In other words, the DC offset may be adjusted so as to compensate for a mismatch between various components of the peak detector 401 that might cause the comparator 510 to generate a high amplitude output signal even when the input signal (i.e., the received RF signal) is zero. In one embodiment, to determine the DC offset, the input to the envelope detector 504 may be set to zero. If the output of the comparator 510 in the absence of the received RF signal is a high amplitude output signal, a binary search may be performed to calibrate the DC offset unit 502. The binary search may be performed by adjusting the output of the DC offset unit 502 to a higher or a lower setting based on the sign of the output of the comparator 510. As one example, a highest DC offset that produces a low amplitude output signal (e.g., a zero output) at the output of the comparator 510 may be selected as the DC offset.

After the subtractor 508 compensates for the DC offset, the output of the subtractor 508 may be provided to one of the input terminals of the comparator 510. The amplitude threshold 506 may be fed as a second input to the comparator 510. The comparator 510 may compare the amplitude of the received RF signal to the amplitude threshold 506 to detect when the amplitude of the received RF signal exceeds the amplitude threshold 506. In one implementation, the amplitude threshold 506 may be provided by a 4-bit digital to analog converter (DAC). In one implementation, the amplitude threshold 506 can be set so that the amplitude of the received RF signal is no more than −4 dBm (e.g., 140 mv @ 50 ohm). In another implementation, the amplitude threshold 506 may be set to other suitable values, and may be determined based, at least in part, on linearity requirements of LNA/mixer in the RF chain and sensitivity requirements of the peak detector 401. The output of the comparator 510 may be sampled to generate a sampled output at a pre-determined frequency. In one implementation, the output of the comparator 510 may be sampled at an ADC clock frequency. In another implementation, the output of the comparator 510 may be sampled at other suitable frequencies.

Figure 9:
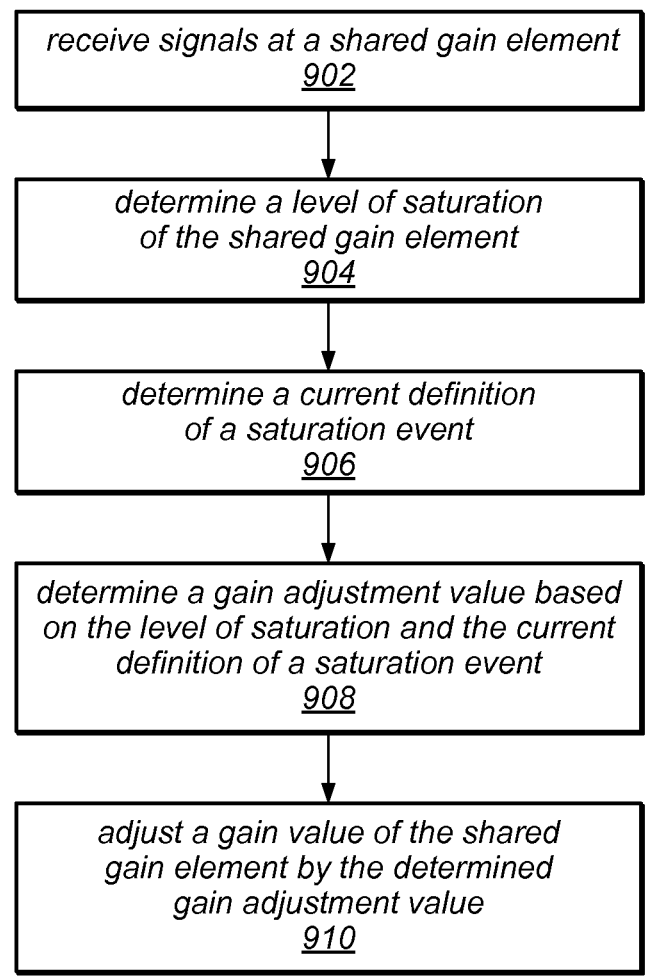
FIG. 9 is a flowchart diagram illustrating one embodiment of a method for adaptively detecting RF saturation in a wireless device implementing multiple wireless protocols.

Referring back to FIG. 4, the RF saturation detection unit 402 may be configured to receive the sampled output signal of the peak detector 401. In one embodiment, the RF saturation detection unit 420 may receive a plurality of samples that indicate whether or not the amplitude of the received RF signal exceeds the amplitude threshold of the peak detector 401. A high amplitude sample may indicates that the amplitude of the received RF signal exceeds the amplitude threshold, while a low amplitude sample may indicate that the amplitude of the received RF signal does not exceed the amplitude threshold. The RF saturation detection unit 402 may generate an output signal that indicates RF saturation based on the detected samples from the peak detector 401. In one implementation, the RF saturation detection unit 402 counts a number of high amplitude samples in a predetermined window, compares the number of high amplitude samples against a set of thresholds, and generates the output signals to indicate how often RF saturation occurs. FIG. 9 further describes operations of the RF saturation detection unit 402 for detecting RF saturation, in particular with respect to embodiments in which RF saturation thresholds may be adjustable, e.g., in response to dynamic reception conditions relating to sharing of the receive chain by multiple wireless protocols.

The gain change unit 408 may be configured to perform coarse and fine gain tuning. Based on the output signals received from the RF saturation detection unit 402, the gain change unit 408 can adjust (e.g., drop) RF gain by a coarse gain drop value. The ADC 412 may convert an analog baseband signal to yield a digital baseband signal. The signal processing unit 414 may filter the digital RF baseband signal, perform IQ calibration, etc. The in-band power calculation unit 410 may be configured to calculate the in-band power of the baseband signal based on input from the signal processing unit 414. Additionally, the ADC processing unit 406 may be configured to determine an ADC power of the digital baseband signal. Based on the in-band power received from the in-band power calculation unit 410 and the ADC power received from the ADC processing unit 406, the gain change unit 108 may be further configured to perform fine gain tuning, in some embodiments.

Figure 6:
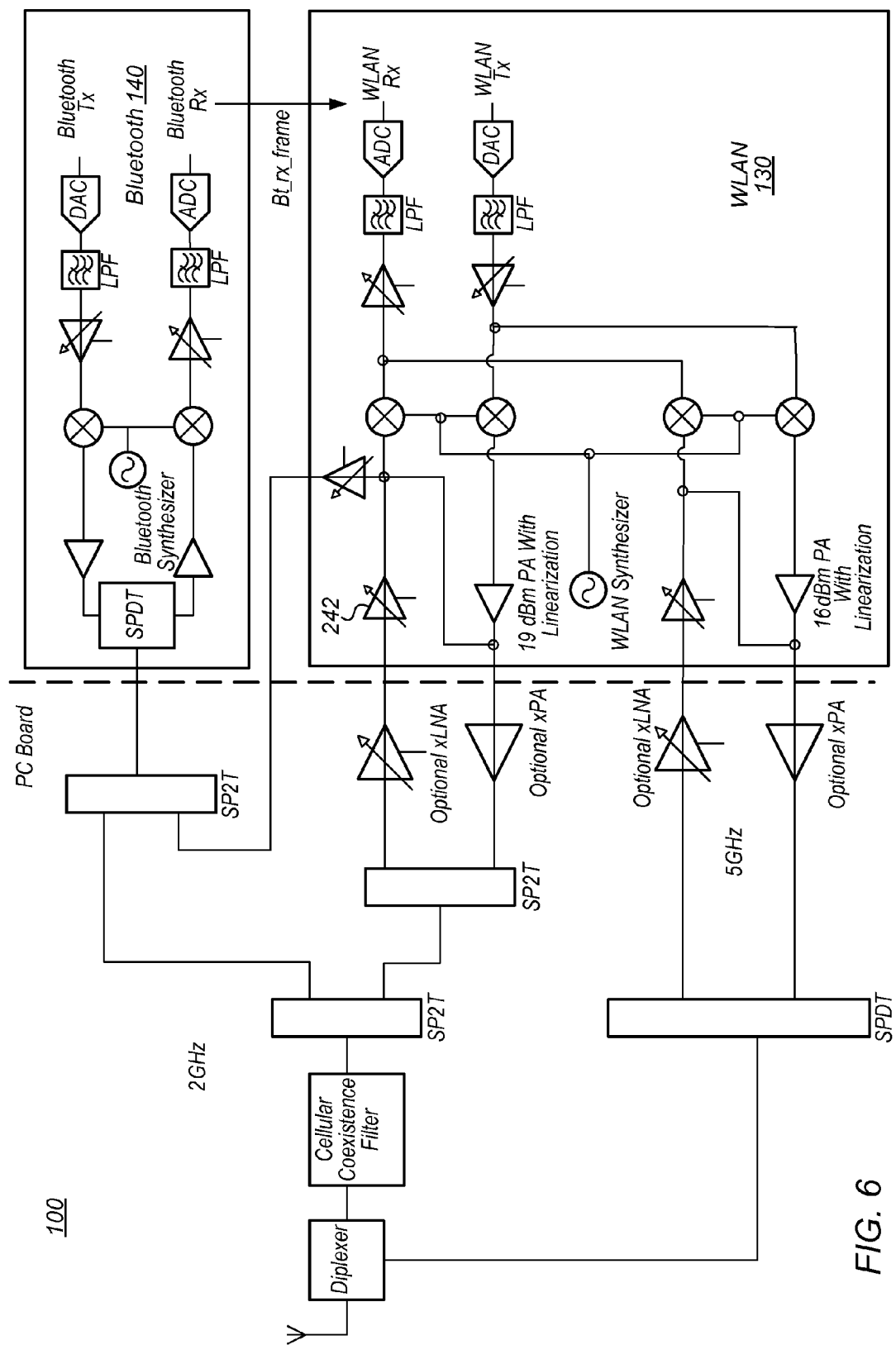
FIGS. 6 and 7 are exemplary system diagrams of the wireless device, according to various embodiments.
Figure 7:
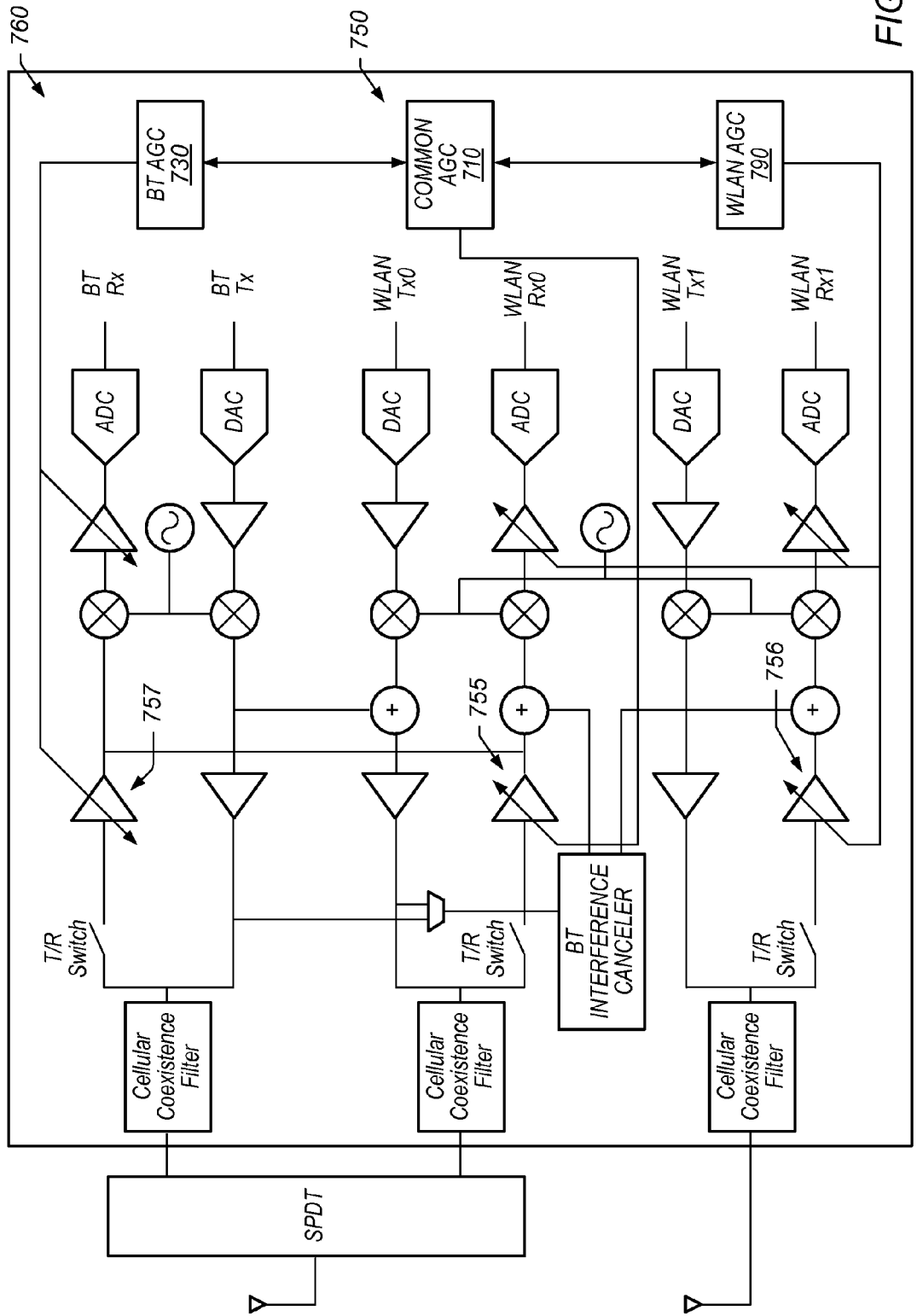

FIGS. 6-7—Exemplary System Diagram of the Wireless Device with Shared Gain Element FIGS. 6 and 7 illustrate exemplary system diagrams of the wireless device 100 according to various embodiments. The wireless device 100 may implement adaptive RF saturation detection and gain adjustment of a shared gain element. FIGS. 6 and 7 illustrate systems that support 2 chain operation; however, further chains are envisioned, such as 3, 4, etc.

FIG. 6 illustrates an example of a two-chip system. In this case, the wireless device 100 may comprise the first wireless protocol circuitry 130 (e.g., WLAN, on a first chip) and the second wireless protocol circuitry 140 (e.g., Bluetooth, on a second chip). The first wireless protocol circuitry 130 may be considered as comprising a shared gain element (LNA) 242, or alternatively the first wireless protocol circuitry 130 may be considered as being coupled to the shared gain element (LNA) 242.

FIG. 7 illustrates an example of a single chip system. In this case, a single chip includes circuitry implementing both the first and second wireless protocols. As in the two-chip system of FIG. 6, the first wireless protocol circuitry 750 (e.g., WLAN) and the second wireless protocol circuitry 760 (e.g., BT) may share a common gain element 755, which may be coupled to common AGC 710. The BT AGC 730 and the WLAN AGC 790 may both be coupled to the common AGC 710.

In both cases, received signals according to both the first wireless protocol and the second wireless protocol may be provided to the shared gain element, before being split out to the first and second wireless protocol circuitries. Since the received signal is amplified in this case before being split out, the signal loss that would normally occur in splitting a signal may be effectively mitigated.

In some embodiments, the wireless device 100 may further include peak detector and RF saturation detection logic, e.g., such as shown in and described with respect to FIGS. 4 and 5. The peak detector and RF saturation detection logic may be used in conjunction with a gain element, such as shared LNA 242 of FIG. 6 or shared LNA 755 of FIG. 7, e.g., according to the method described with respect to FIG. 9. The wireless device may be configured for peak detection at one or more points in the receive chain(s); for example, in the case of the exemplary wireless device of FIG. 7, in some embodiments the wireless device 100 may be configured for peak detection only after shared LNA 755; in other embodiments, the wireless device 100 may also be configured for peak detection after WLAN only LNA 756 and/or BT only LNA 757.

Further details with respect to one- and two-chip systems implementing a shared gain element for simultaneous reception of multiple wireless protocols, such as those exemplary systems illustrated in FIGS. 6 and 7, are provided in U.S. application Ser. No. 12/323,338, titled "Wireless Device Using A Shared Gain Stage For Simultaneous Reception Of Multiple Protocols", U.S. application Ser. No. 12/541,284, titled "Wireless Device Using a Shared Gain Stage for Simultaneous Reception of Multiple Protocols", and U.S. application Ser. No. 12/767,563, titled "Transferring Control of a Common Gain Element in a Wireless Device Supporting Multiple Protocols", all of which are incorporated into the present disclosure by reference, as previously noted.

Figure 8:
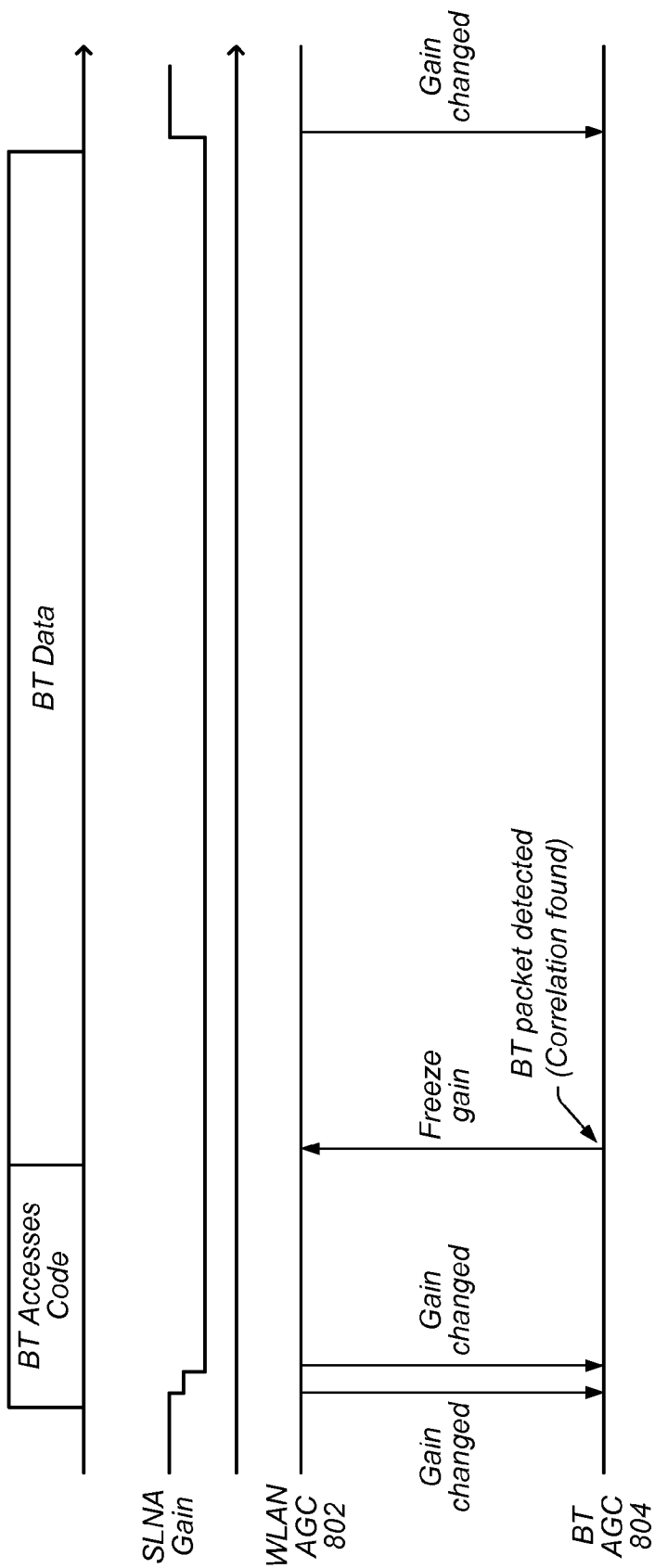
FIG. 8 illustrates an exemplary signal exchange between WLAN circuitry and Bluetooth circuitry during Bluetooth reception according to one particular embodiment.

FIG. 8—Exemplary Signal Exchange Between WLAN and BT

FIG. 8 illustrates an exemplary signal exchange between WLAN AGC 802 and BT AGC 804, according to one set of embodiments in which the first wireless protocol is WLAN and the second wireless protocol is BT, and the shared gain element is a low-noise amplifier (LNA).

In some embodiments, both BT and WLAN AGCs may have the capability to control the gain of the LNA. However, in some embodiments, only WLAN AGC 802 may have control over the LNA gain if WLAN is active. In such cases, WLAN may make all RF gain changes and may inform the BT AGC 804 if there is an LNA gain change and the new gain value for proper RSSI calculation. When WLAN is in sleep mode, control of the shared LNA may be handed over to BT. When WLAN is transmitting, it may set the shared LNA gain to the smallest value to prevent saturation.

In a shared LNA configuration, BT AGC 804 may operate in two different modes. In BT passive mode (e.g., when both BT and WLAN are active), WLAN AGC 802 may control the shared LNA, but BT AGC 804 may still control the gain of BT gain stages after the shared LNA. In this mode, BT AGC 804 can make any gain changes to the gain stages under BT control and may not need to inform WLAN AGC 802 if and when there is gain change. When WLAN AGC 802 changes the gain of the shared LNA, WLAN may inform BT AGC 804, and a gain change may be triggered in BT AGC 804 such that the change in the input signal level may be compensated for. In BT active mode (e.g., when WLAN is in sleep mode), BT AGC 804 may have full control of shared LNA. BT AGC 804 may utilize two separate gain tables for these two different cases.

The exemplary signal exchange between WLAN and Bluetooth AGCs illustrated in FIG. 8 is shown as occurring during reception by Bluetooth, e.g., in the case in which WLAN and BT are both active and BT is operating in passive mode. In this case, as shown, BT might send a "freeze gain" request to WLAN. This request may, for example, be generated when BT detects a valid packet and gets ready to demodulate the packet. As a gain change in the shared LNA while BT is decoding the received packet could potentially cause BT to lose the received packet, the "freeze gain" request may be passed to WLAN AGC 802. When the "freeze gain" request is received by WLAN AGC 802, WLAN tries to keep the shared LNA gain fixed. However, this might not be possible if WLAN has higher probability or a strong saturation is detected in RF stages. Embodiments of the disclosure relate to a method for adaptively detecting RF saturation, e.g., as described in the following section. Adaptively detecting RF saturation, and utilizing the adaptive saturation detection in determining gain adjustments to the shared LNA, may be important in order to keep the gain constant during active reception.

FIG. 9—Method for Adaptively Detecting RF Saturation

FIG. 9 is a flowchart diagram illustrating a method for adaptively detecting radio frequency (RF) saturation in a wireless device configured to simultaneously receive first signals according to a first wireless protocol and second signals according to a second wireless protocol.

The method may be implemented by a wireless device which implements multiple protocols, e.g., a first wireless protocol and a second wireless protocol, such as the device shown in FIGS. 1-8 and described above. In some embodiments the method may be implemented by a chip for use in a wireless device which implements multiple protocols. It is noted, however, that the method may be used with any wireless device, as appropriate, and the wireless protocols may be any wireless protocols. While the steps described below are shown in a certain order, it should be noted that, according to various embodiments, one or more of the steps may be omitted, repeated, or performed in a different order than shown.

In 902, signals may be received at a shared gain element. The signals may include components according to the first wireless protocol and/or the second wireless protocol.

In 904, a level of saturation of the shared gain element may be determined. One technique for detecting RF saturation in a wireless device involves periodically sampling a received signal at a desired point (e.g., after a gain element) in a receive chain. It may then be determined whether the value of the sampled signal is larger than a certain "peak" threshold, i.e., indicating that the sampled signal is near the top of the functional range of the receive chain at that point. If, over the course of multiple samples, the signal is determined to be consistently or repeatedly larger than the peak threshold, this may (e.g., depending on a current definition of saturation) indicate that the signal is undergoing RF saturation.

In one envisioned embodiment, for example, a wireless device might implement a peak detector including an analog portion (e.g., for sampling the signal) in combination with a digital portion. The digital portion of the peak detector would take the analog peak detector output and count the number of samples whose values are larger than the peak detector threshold. The peak count could be calculated over a windows of 32 samples, or any other number of samples, as desired. The peak count may in this case be considered a level of saturation, insofar as the peak count may be indicative of (e.g., proportional to) the level of RF saturation. It should be noted that other methods of determining RF saturation levels (and/or definitions of RF saturation levels) may be used instead of or in addition to such a method (and/or definition), if desired.

In 906, a current definition of a saturation event may be determined. For example, in one embodiment, if the peak count in a given window exceeds a certain "saturation threshold", a saturation event may be declared. Thus, one or more saturation thresholds may in some embodiments be considered to define a saturation event. However, other ways of defining saturation events are also considered.

In order to avoid continued RF saturation, it may be desirable to adjust a gain value (e.g., of a gain element in the receive chain prior to the peak detector) in response to a saturation event. Furthermore, in some embodiments, it may be desirable to implement multiple saturation thresholds. This would, for example, allow for more moderate gain adjustments in response to more moderate saturation levels, or more extreme gain adjustments in response to more extreme saturation levels.

In one embodiment, for example, the peak count could be compared with a threshold "tally_thr_low" as an initial comparison. If the count is larger than tally_thr_low, a saturation event would be declared. The severity of the saturation would be decided by comparing the peak count with saturation thresholds "tally_thr_low", "tall_thr_med" and "tally_thr_high". Gain could then be dropped according to the determined severity of the saturation, e.g., by corresponding gain drop values "rf_gain_drop_db_low", "rf_gain_drop_db_med", and "rf_gain_drop_db_high".

In a situation in which the wireless device implements multiple wireless protocols, and in which the wireless device includes a shared receive chain in which there is a shared gain element (such as shown and described in FIGS. 1-8), it may further be desirable to dynamically modify saturation detection in the wireless device. For example, it may be desirable to modify the sensitivity of the peak detector to saturation events depending on the reception state of the wireless device with respect to one or both of the wireless protocols, and/or the priority status of one or both of the wireless protocols. As an exemplary implementation, in the case that one of the wireless protocols is WLAN and the other wireless protocol is Bluetooth, there are four possible combinations of reception states:

1. Both WLAN and BT are in search state.
2. BT is currently receiving a packet.
3. WLAN is currently receiving a packet.
4. Both WLAN and BT are in Rx state.

In each of these cases, there are also the possibilities that WLAN may have priority, or that BT may have priority, or that WLAN and BT may have equal priority. Each of these different cases may have a different optimal sensitivity to saturation. For example, it might be wise to have a stricter saturation threshold when WLAN is receiving and WLAN has priority. In this case, it may be better not to change the LNA gain easily, as that could result in loss of a high priority WLAN packet.

Thus, in some embodiments, the wireless device may be configured to dynamically adjust a definition of a saturation event, e.g., based on the reception state of the wireless device with respect to one or both of the wireless protocols, and/or the priority status of one or both of the wireless protocols.

In 908, a gain adjustment value may be determined based on the level of saturation and the current definition of a saturation event.

It should be noted that in various embodiments, adjustment of saturation event definitions and responses could be as dynamic as desired. For example, as many different saturation levels (or a continuous saturation curve) as desired could be defined for any of the various situations in which dynamic saturation sensitivity is desirable, with as many corresponding gain adjustment values (or continuous curves). However, for simplicity and efficiency of implementation, it may be desirable in some embodiments to limit the number of defined saturation levels and corresponding gain adjustment values, and the number of sets of defined saturation levels and corresponding gain adjustment values.

For example, in one set of embodiments, the wireless device may implement dynamic saturation sensitivity by utilizing a set of look-up tables (LUTs), e.g., with different saturation thresholds and gain adjustment values for different situations. For example, there might be one set of LUTs including different sets of saturation thresholds and corresponding gain adjustments, and another LUT defining which set of saturation thresholds and corresponding gain adjustments should be used under which circumstances. Tables 1 and 2 below are examples (again referring to a situation in which the wireless protocols are WLAN and BT) of such LUTs according to one set of embodiments.

TABLE 1

Example values for tally count (over the course of a 32 sample window) and gain changes for different sets.

| | Set 0 | | Set 1 | | Set 2 | |
|---|---|---|---|---|---|---|
| | Tally | Gain drop | Tally | Gain drop | Tally | Gain drop |
| Non  |    | 6  |    | 12 |    | 18 |
| High | 21 | 18 | 25 | 24 | 29 | 30 |
| Med  | 14 | 12 | 21 | 18 | 25 | 24 |
| Low  | 7  | 6  | 14 | 12 | 21 | 18 |

TABLE 2

Saturation threshold and gain change sets for different scenarios.

| | Equal priority | WLAN has priority | BT has priority |
|---|---|---|---|
| Case 1 | Set 0 | Set 0 | Set 0 |
| Case 2 | Set 1 | Set 1 | Set 2 |
| Case 3 | Set 2 | Set 3 | Set 1 |
| Case 4 | Set 3 | Set 3 | Set 3 |

Cases 1-4 shown in Table 2 refer in this example to the four possible combinations of reception states described above. "Set 3" in this example is used to completely disable peak detector trigger events. As shown in Table 1, each set may define progressively more strict definitions of saturation events. Accordingly, as shown in Table 2, scenarios involving varying desired levels of strictness can be assigned appropriately strict saturation definitions. For example, if both WLAN and BT are in a search state (Case 1), gain changes will not interfere with packet reception, so gain adjustments even in response to relatively low levels of saturation may be appropriate. In contrast, if both WLAN and BT are currently receiving a packet, gain changes could potentially cause packet loss, so gain adjustments may not be appropriate regardless of saturation level. If only one of WLAN or BT is currently receiving a packet, the relative priority of WLAN and BT may determine at what level of saturation gain changes are or are not appropriate; for example, if only BT is currently receiving a packet, but WLAN has priority, it may still be desirable to adjust the gain moderately in response to a moderate level of saturation, even though it may cause some loss for BT, in order to be able to successfully receive high-priority incoming WLAN packets.

Thus, after the gain adjustment value has been determined, a gain value of the shared gain element may be adjusted by the determined gain adjustment value in step 910.

In one exemplary implementation, baseband (BB) logic may be used to select which of these sets will be used depending on the priority of WLAN/BT (e.g., provided by MAC) and the current AGC state, e.g., according to Table 2. Which set should be used in each case (e.g., Table 2, or similar information) may also be programmed into software. The priorities may be determined by using weight tables for BT and WLAN and may be changed by MAC on a per-packet basis and passed to BB. Accordingly, choice of which set of saturation thresholds and corresponding gain changes may also be made on a per-packet basis, if desired.

In some embodiments, such as those shown in FIGS. 6-7, the wireless device may implement multiple receive chains. For example, there may be a shared BT/WLAN receive chain ("chain 0") and a WLAN only (e.g., 5 GHz) receive chain ("chain 1"). In some embodiments, saturation detection may be implemented on each receive chain. Such saturation detection (and corresponding gain adjustments) may be implemented independently, if desired, or may be interconnected. Interconnection may in some embodiments be desirable. For example, if saturation is detected in one receive chain but not another, it may still be desirable to make a gain adjustment in both receive chains. This is shown in Table 1 in the "non" line; in this case if saturation is detected in another receive chain, gain may be adjusted in the target receive chain by the amount specified in the "non" row even if the saturation level in the target chain does not meet any of the saturation thresholds.

It should also be noted that in some embodiments implementing multiple receive chains, the above-described multiple sets of threshold values may be used for both chains of WLAN if any of the chains is shared. However, in a scenario in which no receive chains are shared (e.g., a 3 antenna configuration in which BT, WLAN 2.4 GHz, and WLAN 5 GHz each have their own receive chain), it may be appropriate to use a single set of saturation thresholds and corresponding gain adjustments for all receive chains and in all reception state and priority situations.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A wireless device, comprising:
    an antenna for receiving wireless signals;
    first wireless protocol circuitry coupled to the antenna and configured to receive first signals from the antenna,
    wherein the first wireless protocol circuitry is configured to process the first signals according to the first wireless protocol;
    second wireless protocol circuitry coupled to the antenna and configured to receive second signals from the antenna,
    wherein the second wireless protocol circuitry is configured to process the second signals according to the second wireless protocol;
    a first shared gain element utilized by the first wireless protocol circuitry and the second wireless protocol circuitry; and
    logic configured to detect saturation events for received signals, wherein the logic is configured to adjust a gain value of the first shared gain element based at least in part on a detected saturation event;
    wherein the logic is configured to dynamically adjust a definition of a saturation event based at least in part on a priority of one or more of the first signals or the second signals.

2. The wireless device of claim 1,
    wherein the logic is configured to adjust the definition of a saturation event based at least in part on a reception state of one or more of the first wireless protocol circuitry or the second wireless protocol circuitry.

3. The wireless device of claim 1,
    wherein the logic is configured to dynamically adjust the definition of a saturation event on a per-packet basis.

4. The wireless device of claim 1,
    wherein the logic is configured to:
        determine a level of saturation of the first shared gain element;
        determine a look-up table (LUT) corresponding to current reception states of the first and second wireless protocol circuitries and priorities of the first and second signals, wherein the LUT relates levels of saturation to gain adjustment values;
        determine a gain adjustment value corresponding to the determined level of saturation based at least in part on the LUT;
        adjust the gain value of the first shared gain element by the determined gain adjustment value.

5. The wireless device of claim 4,
    wherein the wireless device comprises a plurality of LUTs corresponding to various possible reception states of the first and second wireless protocol circuitries and priorities of the first and second signals.

6. The wireless device of claim 1,
    wherein the first wireless protocol is WLAN and the second wireless protocol is Bluetooth.

7. A method for avoiding radio frequency (RF) saturation in a wireless device configured to simultaneously receive first signals according to a first wireless protocol and second signals according to a second wireless protocol, the method comprising:
    receiving signals at a shared gain element, wherein the received signals comprise the first signals and the second signals;
    determining a level of saturation of the shared gain element;
    determining a current definition of a saturation event based at least in part on a priority of one or more of the first signals or the second signals;
    determining a gain adjustment value based at least in part on the level of saturation and the current definition of a saturation event;
    adjusting a gain value of the shared gain element by the determined gain adjustment value.

8. The method of claim 7,
    wherein said determining the current definition of a saturation event is based at least in part on a reception state of the wireless device with respect to one or more of the first signals or the second signals.

9. The method of claim 7,
    wherein said determining the level of saturation, determining the current definition of a saturation event, determining the gain adjustment value, and adjusting the gain value are performed on a per-packet basis.

10. The method of claim 7, the method further comprising:
    determining a look-up table (LUT) corresponding to current reception states of the wireless device with respect to the first and second signals and priorities of the first and second signals, wherein the LUT relates levels of saturation to gain adjustment values;
    wherein the determined gain adjustment value is a gain adjustment value corresponding to the determined level of saturation in the determined LUT.

11. The method of claim 10,
    wherein the determined the LUT is chosen from a plurality of LUTs corresponding to various possible reception states of the wireless device with respect to the first and second signals and priorities of the first and second signals.

12. The method of claim 7,
    wherein the first wireless protocol is WLAN and the second wireless protocol is Bluetooth.

13. A chip for use in a wireless device, wherein the wireless device comprises an antenna for receiving wireless signals, wherein the wireless device is configured to implement a first wireless protocol and a second wireless protocol, the chip comprising:

a first shared gain element, wherein the first shared gain element is configured to receive signals, wherein the received signals comprise both first signals configured for processing according to the first wireless protocol and second signals configured for processing according to the second wireless protocol;

logic configured to detect saturation events for received signals, wherein the logic is configured to adjust a gain value of the first shared gain element based at least in part on a detected saturation event;

wherein the logic is configured to dynamically adjust a definition of a saturation event based at least in part on a priority of one or more of the first signals or the second signals.

14. The chip of claim 13, wherein the wireless device further comprises first wireless protocol circuitry configured to receive and process first signals and second wireless protocol circuitry configured to receive and process second signals, wherein the logic is configured to adjust the definition of a saturation event based at least in part on:
a reception state of one or more of the first wireless protocol circuitry or the second wireless protocol circuitry.

15. The chip of claim 14,
wherein the chip comprises the first wireless protocol circuitry.

16. The chip of claim 14,
wherein the chip comprises both the first wireless protocol circuitry and the second wireless protocol circuitry.

* * * * *